US012651619B2

(12) United States Patent
Chen et al.

(10) Patent No.: US 12,651,619 B2
(45) Date of Patent: Jun. 9, 2026

(54) MEMORY DEVICE

(71) Applicant: TAIWAN SEMICONDUCTOR MANUFACTURING COMPANY, LTD., Hsinchu (TW)

(72) Inventors: Chien-Yuan Chen, Hsinchu City (TW); Hau-Tai Shieh, Hsinchu City (TW); Cheng Hung Lee, Hsinchu County (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 124 days.

(21) Appl. No.: 18/392,215

(22) Filed: Dec. 21, 2023

(65) Prior Publication Data

US 2025/0210075 A1      Jun. 26, 2025

(51) Int. Cl.
G11C 7/10       (2006.01)
G11C 7/04       (2006.01)
G11C 7/14       (2006.01)

(52) U.S. Cl.
CPC .............. *G11C 7/1048* (2013.01); *G11C 7/04* (2013.01); *G11C 7/14* (2013.01)

(58) Field of Classification Search
CPC ............ G11C 7/1048; G11C 7/04; G11C 7/14
USPC ...................................................... 365/185.25
See application file for complete search history.

(56) References Cited

U.S. PATENT DOCUMENTS

| | | | | |
|---|---|---|---|---|
| 5,835,432 A | * | 11/1998 | Nakano | G11C 7/067 |
| | | | | 365/204 |
| 2013/0064028 A1 | * | 3/2013 | Kawasumi | G11C 7/12 |
| | | | | 365/203 |

* cited by examiner

*Primary Examiner* — Huan Hoang
(74) *Attorney, Agent, or Firm* — Birch, Stewart, Kolasch & Birch, LLP

(57) ABSTRACT

A memory device includes a memory cell and an amplifier. The memory cell is configured to store a first data bit. The amplifier is configured to generate a first data signal at a first node according to the first data bit, and configured to charge the first node according to a precharge signal. After the first node is charged according to the precharge signal, the amplifier is further configured to discharge the first node according to the precharge signal.

20 Claims, 7 Drawing Sheets

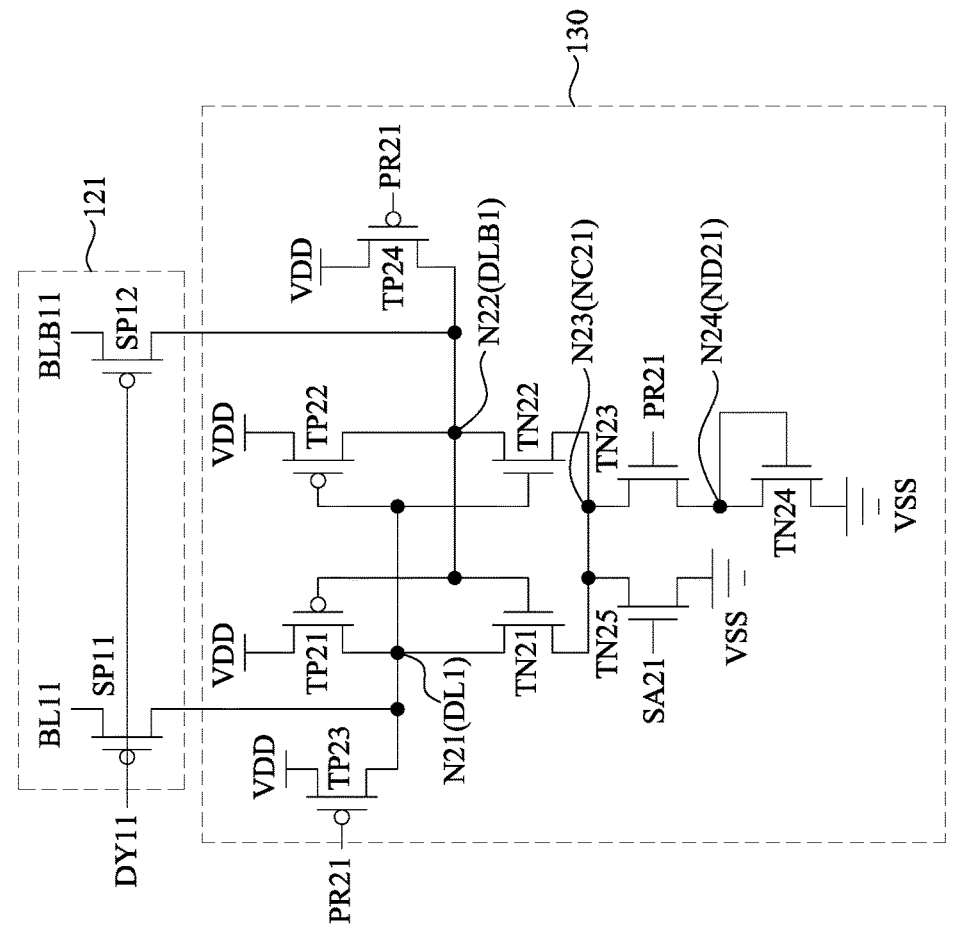
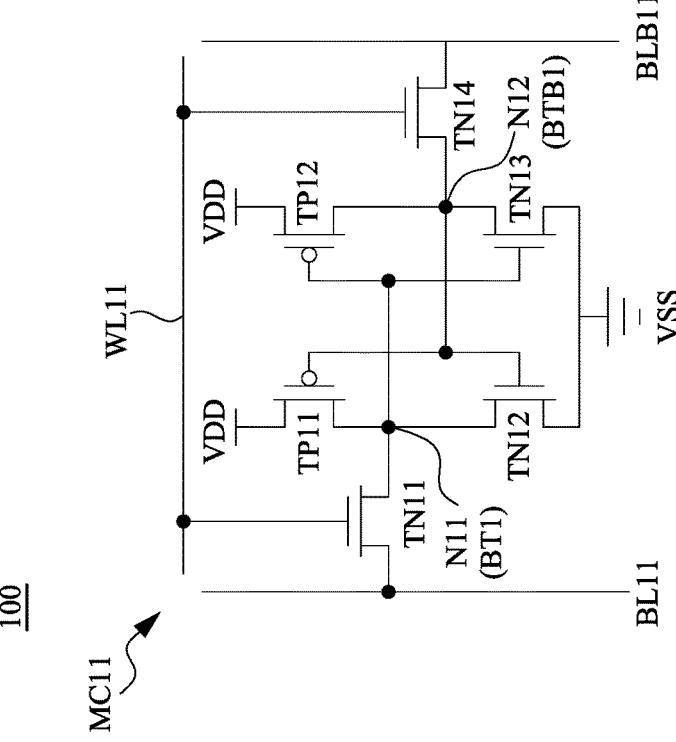
FIG. 2

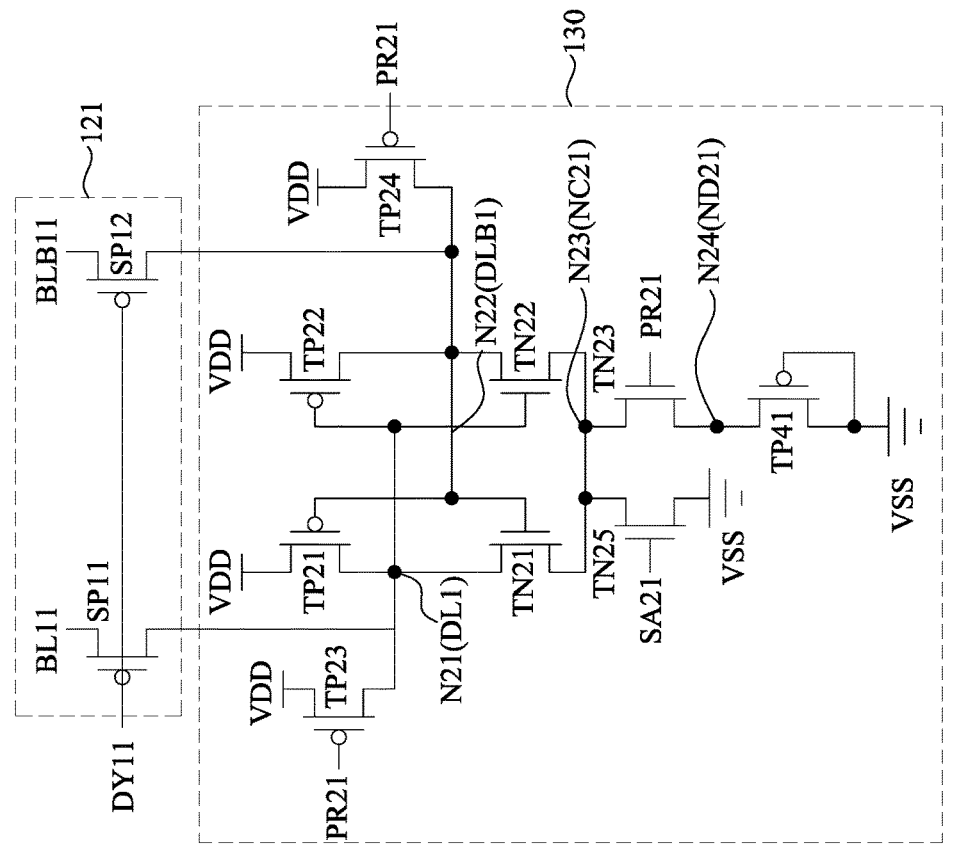
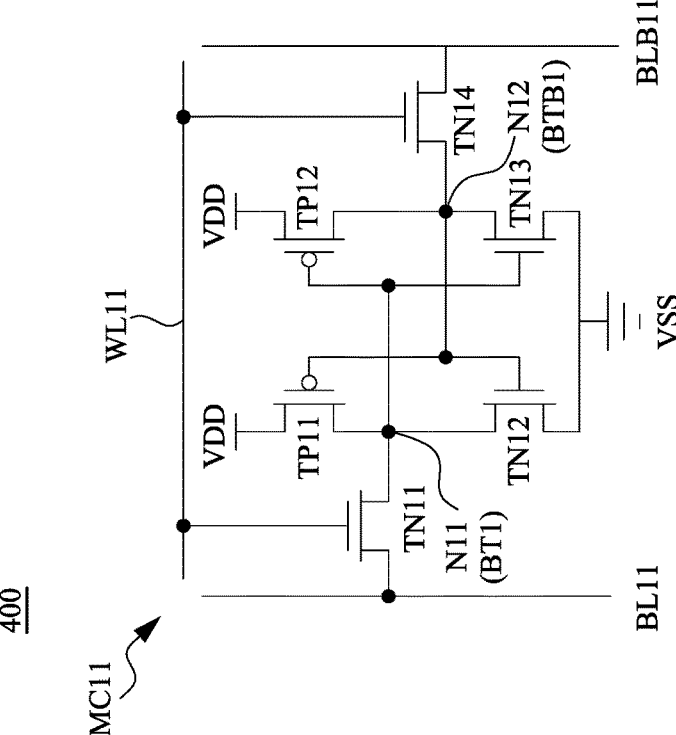
FIG. 4

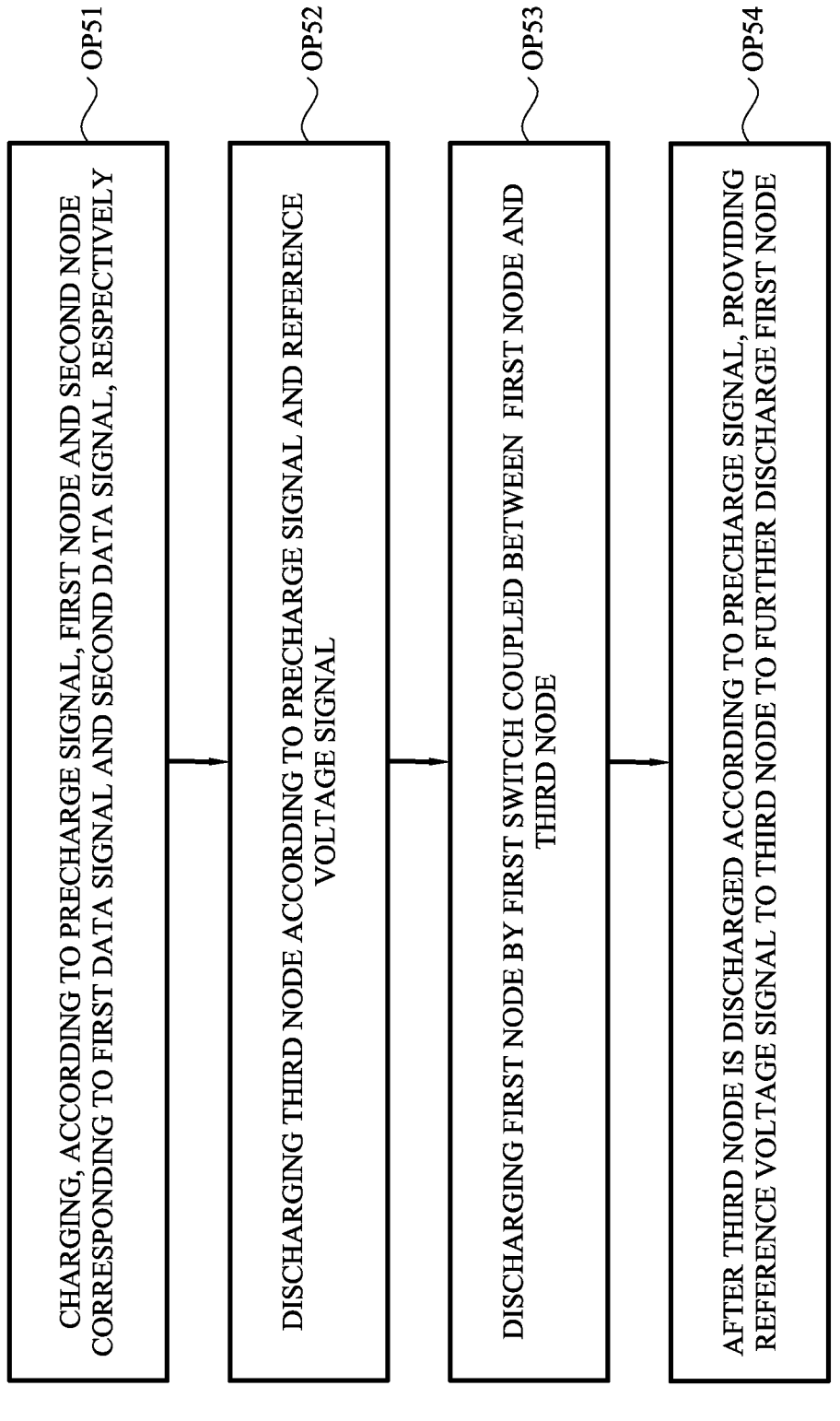

500

CHARGING, ACCORDING TO PRECHARGE SIGNAL, FIRST NODE AND SECOND NODE CORRESPONDING TO FIRST DATA SIGNAL AND SECOND DATA SIGNAL, RESPECTIVELY

OP51

DISCHARGING THIRD NODE ACCORDING TO PRECHARGE SIGNAL AND REFERENCE VOLTAGE SIGNAL

OP52

DISCHARGING FIRST NODE BY FIRST SWITCH COUPLED BETWEEN FIRST NODE AND THIRD NODE

OP53

AFTER THIRD NODE IS DISCHARGED ACCORDING TO PRECHARGE SIGNAL, PROVIDING REFERENCE VOLTAGE SIGNAL TO THIRD NODE TO FURTHER DISCHARGE FIRST NODE

MEMORY DEVICE

BACKGROUND

A memory device generates a data line signal by a sensing amplifier according to a data bit stored in a memory cell. When a word line signal is activated, a bit line signal is pulled down by the memory cell. However, due to a size of the memory cell is small and a bit line loading of the memory array is heavy, the memory array will consume many time for reading out the data bit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a circuit diagram of detail of a part of the memory device shown in FIG. 1, in accordance with some embodiments of the present disclosure.

FIG. 4 is a circuit diagram of detail of a part of a memory device corresponding to the memory device shown in FIG. 2, in accordance with some embodiments of the present disclosure.

FIG. 5 is a flowchart diagram of a method operating the memory device shown in FIG. 2, in accordance with some embodiments of the present disclosure.

DETAILED DESCRIPTION

Figure 1:
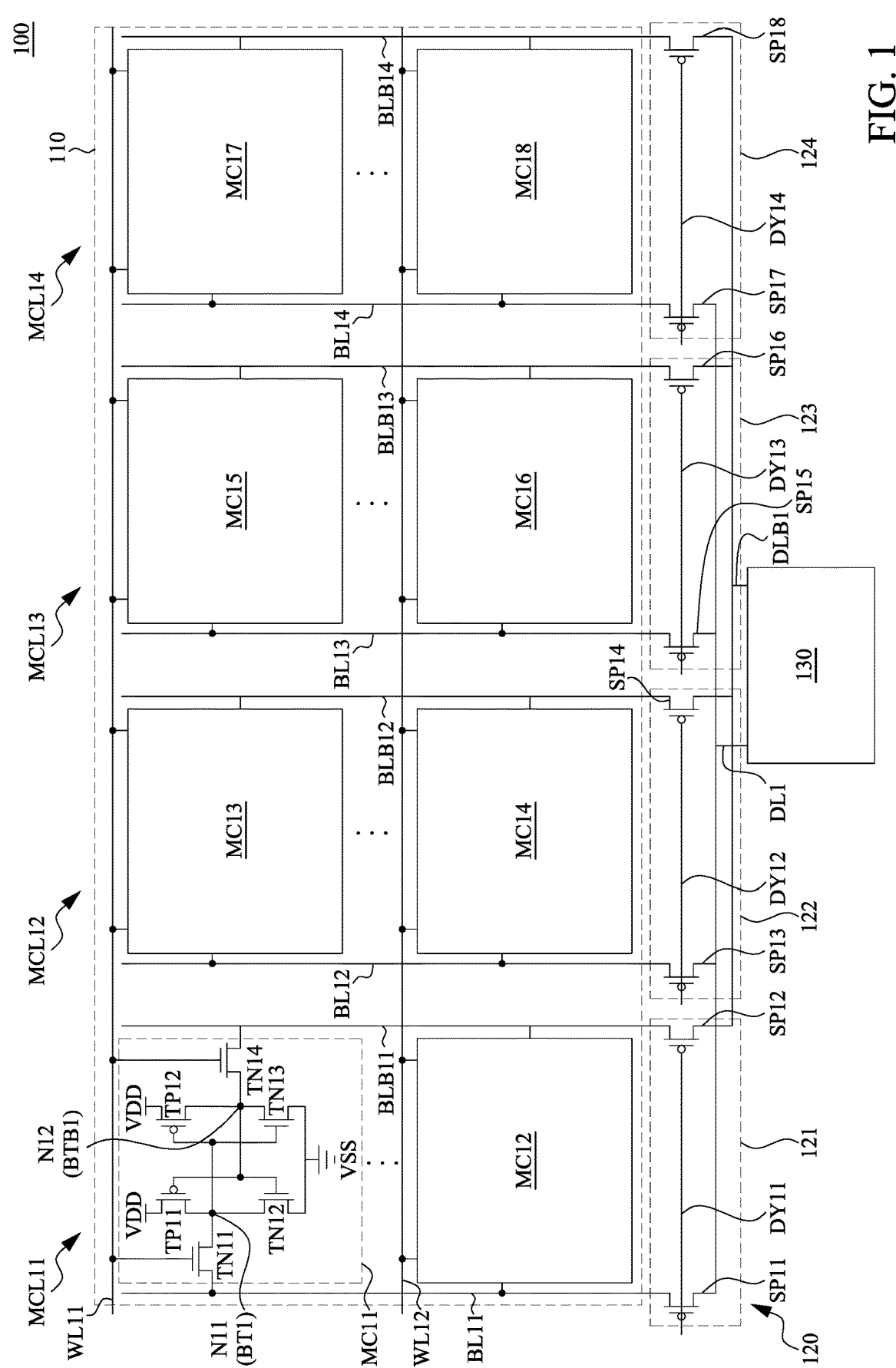
FIG. 1 is a schematic diagram of a memory device, in accordance with some embodiments of the present disclosure.

The following disclosure provides many different embodiments, or examples, for implementing different features of the provided subject matter. Specific examples of components, materials, values, steps, arrangements or the like are described below to simplify the present disclosure. These are, of course, merely examples and are not intended to be limiting. Other components, materials, values, steps, arrangements or the like are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. As used herein, "around," "about," "approximately," or "substantially" may generally mean within 20 percent, or within 10 percent, or within 5 percent of a given value or range. Numerical quantities given herein are approximate, meaning that the term "around," "about," "approximately," or "substantially" can be inferred if not expressly stated. One skilled in the art will realize, however, that the values or ranges recited throughout the description are merely examples, and may be reduced or varied with the downscaling of the integrated circuits.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noting that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/or" includes any of the associated listed items and all combinations of one or more of the associated listed items.

FIG. 1 is a schematic diagram of a memory device 100, in accordance with some embodiments of the present disclosure. As illustratively shown in FIG. 1, the memory device 100 includes a memory array 110, a column selector 120 and an amplifier 130. In some embodiments, the amplifier 130 is implemented by a sensing amplifier, and the memory array 110 is implemented by a static random-access memory (SRAM) array.

In some embodiments, the memory array 110 includes multiple memory columns, such as memory columns MCL11-MCL14 shown in FIG. 1. The column selector 120 is configured to select one of the memory columns MCL11-MCL14 and is configured to generate data line signals DL1 and DLB1 according to data bits stored in the one of the memory columns MCL11-MCL14. The amplifier 130 is configured to generate the data line signals DL1 and DLB1. In some embodiments, the data line signals DL1 and DLB1 are complementary with each other.

In some embodiments, each of the memory columns MCL11-MCL14 includes multiple memory cells. As illustratively shown in FIG. 1, the memory column MCL11 includes memory cells MC11 and MC12. The memory column MCL12 includes memory cells MC13 and MC14.

The memory column MCL13 includes memory cells MC15 and MC16. The memory column MCL14 includes memory cells MC17 and MC18.

As illustratively shown in FIG. 1, each of the memory cells MC11, MC13, MC15 and MC17 is configured to receive a word line signal WL11. Each of the memory cells MC12, MC14, MC16 and MC18 is configured to receive a word line signal WL12. During read operations, each of the memory cells MC11 and MC12 is configured to output bit line signals BL11 and BLB11. Each of the memory cells MC13 and MC14 is configured to output bit line signals BL12 and BLB12. Each of the memory cells MC15 and MC16 is configured to output bit line signals BL13 and BLB13. Each of the memory cells MC17 and MC18 is configured to output bit line signals BL14 and BLB14.

In some embodiments, the bit line signals BL11 and BLB11 are complementary with each other. The bit line signals BL12 and BLB12 are complementary with each other. The bit line signals BL13 and BLB13 are complementary with each other. The bit line signals BL14 and BLB14 are complementary with each other.

As illustratively shown in FIG. 1, the memory cell MC11 includes switches TN11-TN14 and TP11-TP12. In some embodiments, a conductive type of the switches TN11-TN14 is different from a conductive type of the switches TP11-TP12. For example, the switches TN11-TN14 are implemented by N-type metal-oxide-semiconductor (NMOS) transistors, and the switches TP11-TP12 are implemented by P-type metal-oxide-semiconductor (PMOS) transistors.

As illustratively shown in FIG. 1, a control terminal of the switch TN11 is configured to receive the word line signal WL11, a terminal of the switch TN11 is configured to output the bit line signal BL11, and another terminal of the switch TN11 is coupled to a node N11. A control terminal of the switch TN14 is configured to receive the word line signal WL11, a terminal of the switch TN14 is configured to output the bit line signal BLB11, and another terminal of the switch TN14 is coupled to a node N12.

As illustratively shown in FIG. 1, a control terminal of the switch TN12 is coupled to the node N12, a terminal of the switch TN12 is configured to receive a reference voltage signal VSS, and another terminal of the switch TN12 is coupled to the node N11. A control terminal of the switch TN13 is coupled to the node N11, a terminal of the switch TN13 is configured to receive the reference voltage signal VSS, and another terminal of the switch TN13 is coupled to the node N12.

Similarly, a control terminal of the switch TP11 is coupled to the node N12, a terminal of the switch TP11 is configured to receive a reference voltage signal VDD, and another terminal of the switch TP11 is coupled to the node N11. A control terminal of the switch TP12 is coupled to the node N11, a terminal of the switch TP12 is configured to receive the reference voltage signal VDD, and another terminal of the switch TP12 is coupled to the node N12. In some embodiments, a voltage level of the reference voltage signal VDD is higher than voltage level of the reference voltage signal VSS.

In some embodiments, the memory cell MC11 is configured to store data bits BT1 and BTB1 at the nodes N11 and N12, respectively. The data bits BT1 and BTB1 are complementary with each other. During the read operation, the word line signal WL11 has an enable voltage level to turn on each of the switches TN11 and TN14, such that a voltage level of the bit line signal BL11 corresponds to a logic value of the data bit BT1, and a voltage level of the bit line signal BLB11 corresponds to a logic value of the data bit BTB1.

For example, when the data bits BT1 and BTB1 have logic values of 0 and 1, respectively, the bit line signals BL11 and BLB11 have voltage levels VL and VH, respectively. When the data bits BT1 and BTB1 have the logic values of 1 and 0, respectively, the bit line signals BL11 and BLB11 have the voltage levels VH and VL, respectively. In some embodiments, the voltage level VH is higher than the voltage level VL.

In some embodiments, configurations of each of the memory cells MC12-MC18 are similar with the configurations of the memory cell MC11. Therefore, some descriptions are not repeated for brevity.

In some embodiments, when the word line signal WL11 has the enable voltage level, the memory cell MC13 is configured to generate the bit line signals BL12 and BLB12, the memory cell MC15 is configured to generate the bit line signals BL13 and BLB13, and the memory cell MC17 is configured to generate the bit line signals BL14 and BLB14.

Similarly, when the word line signal WL12 has the enable voltage level, the memory cell MC12 is configured to generate the bit line signals BL11 and BLB11, the memory cell MC14 is configured to generate the bit line signals BL12 and BLB12, the memory cell MC16 is configured to generate the bit line signals BL13 and BLB13, and the memory cell MC18 is configured to generate the bit line signals BL14 and BLB14.

In some embodiments, the column selector 120 is configured to select one of the bit line signals BL11-BL14 and one of the bit line signals BLB11-BLB14 for generating the data line signals DL1 and DLB1. As illustratively shown in FIG. 1, the column selector 120 includes select circuits 121-124. The select circuit 121 is configured to transmit the bit line signals BL11 and BLB11 to the amplifier 130 for generating the data line signals DL1 and DLB1. The select circuit 122 is configured to transmit the bit line signals BL12 and BLB12 to the amplifier 130 for generating the data line signals DL1 and DLB1. The select circuit 123 is configured to transmit the bit line signals BL13 and BLB13 to the amplifier 130 for generating the data line signals DL1 and DLB1. The select circuit 124 is configured to transmit the bit line signals BL14 and BLB14 to the amplifier 130 for generating the data line signals DL1 and DLB1.

As illustratively shown in FIG. 1, the select circuit 121 includes switches SP11 and SP12. Control terminals of each of the switches SP11 and SP12 is configured to receive a decoder signal DY11. A terminal of the switches SP11 is configured to receive the bit line signal BL11, another terminal of the switches SP11 is configured to output the data line signal DL1. A terminal of the switches SP12 is configured to receive the bit line signal BLB11, another terminal of the switches SP12 is configured to output the data line signal DLB1.

Similarly, the select circuit 122 includes switches SP13 and SP14. Control terminals of each of the switches SP13 and SP14 is configured to receive a decoder signal DY12. A terminal of the switch SP13 is configured to receive the bit line signal BL12, another terminal of the switch SP13 is configured to output the data line signal DL1. A terminal of the switch SP14 is configured to receive the bit line signal BLB12, another terminal of the switch SP14 is configured to output the data line signal DLB1.

Similarly, the select circuit 123 includes switches SP15 and SP16. Control terminals of each of the switches SP15 and SP16 is configured to receive a decoder signal DY13. A terminal of the switch SP15 is configured to receive the bit line signal BL13, another terminal of the switch SP15 is configured to output the data line signal DL1. A terminal of the switch SP16 is configured to receive the bit line signal BLB13, another terminal of the switch SP16 is configured to output the data line signal DLB1.

Similarly, the select circuit 124 includes switches SP17 and SP18. Control terminals of each of the switches SP17 and SP18 is configured to receive a decoder signal DY14. A terminal of the switch SP17 is configured to receive the bit line signal BL14, another terminal of the switch SP17 is configured to output the data line signal DL1. A terminal of the switch SP18 is configured to receive the bit line signal BLB14, another terminal of the switch SP18 is configured to output the data line signal DLB1. In some embodiments, the switches SP11-SP18 are implemented by PMOS transistors.

FIG. 2 is a circuit diagram of detail of a part of the memory device 100 shown in FIG. 1, in accordance with some embodiments of the present disclosure. As illustratively shown in FIG. 2, the amplifier 130 includes switches TN21-TN25 and TP21-TP24. In some embodiments, a conductive type of the switches TN21-TN25 is different from a conductive type of the switches TP21-TP24. For example, the switches TN21-TN25 are implemented by NMOS transistors, and the switches TP21-TP24 are implemented by PMOS transistors.

As illustratively shown in FIG. 2, a terminal of the switch TP21 is coupled to a node N21, another terminal of the switch TP21 is configured to receive the reference voltage signal VDD, and a control terminal of the switch TP21 is coupled to a node N22. A terminal of the switch TP22 is coupled to the node N22, another terminal of the switch TP22 is configured to receive the reference voltage signal VDD, and a control terminal of the switch TP22 is coupled to the node N21.

As illustratively shown in FIG. 2, a terminal of the switch TP23 is coupled to the node N21, another terminal of the switch TP23 is configured to receive the reference voltage signal VDD, and a control terminal of the switch TP23 is configured to receive a precharge signal PR21. A terminal of the switch TP24 is coupled to the node N22, another terminal of the switch TP24 is configured to receive the reference voltage signal VDD, and a control terminal of the switch TP24 is configured to receive the precharge signal PR21.

As illustratively shown in FIG. 2, a terminal of the switch TN21 is coupled to the node N21, another terminal of the switch TN21 is coupled to a node N23, and a control terminal of the switch TN21 is coupled to the node N22. A terminal of the switch TN22 is coupled to the node N22, another terminal of the switch TN22 is coupled to the node N23, and a control terminal of the switch TN22 is coupled to the node N21.

As illustratively shown in FIG. 2, a terminal of the switch TN23 is coupled to the node N23, another terminal of the switch TN23 is coupled to a node N24, and a control terminal of the switch TN23 is configured to receive the precharge signal PR21. A terminal of the switch TN24 is coupled to the node N24, another terminal of the switch TN24 is configured to receive the reference voltage signal VSS, and a control terminal of the switch TN24 is coupled to the node N24. A terminal of the switch TN25 is coupled to the node N23, another terminal of the switch TN25 is configured to receive the reference voltage signal VSS, and a control terminal of the switch TN24 is configured to receive a control signal SA21.

For illustration purpose, in the embodiment shown in FIG. 2, the amplifier 130 is configured to generate the data line signals DL1 and DLB1 at the nodes N21 and N22 according to the data bits BT1 and BTB1 stored in the memory cell MC11. However, the embodiments of present disclosure are not limited to this. In various embodiments, the amplifier 130 is configured to generate the data line signals DL1 and DLB1 according to data bits stored in memory cells other than the memory cell MC11. For example, referring to FIG. 1 and FIG. 2, when the word line signal WL12 and the decoder signal DY12 are activated, the amplifier 130 generates the data line signals DL1 and DLB1 according to the data bits stored in the memory cell MC14.

Figure 3:
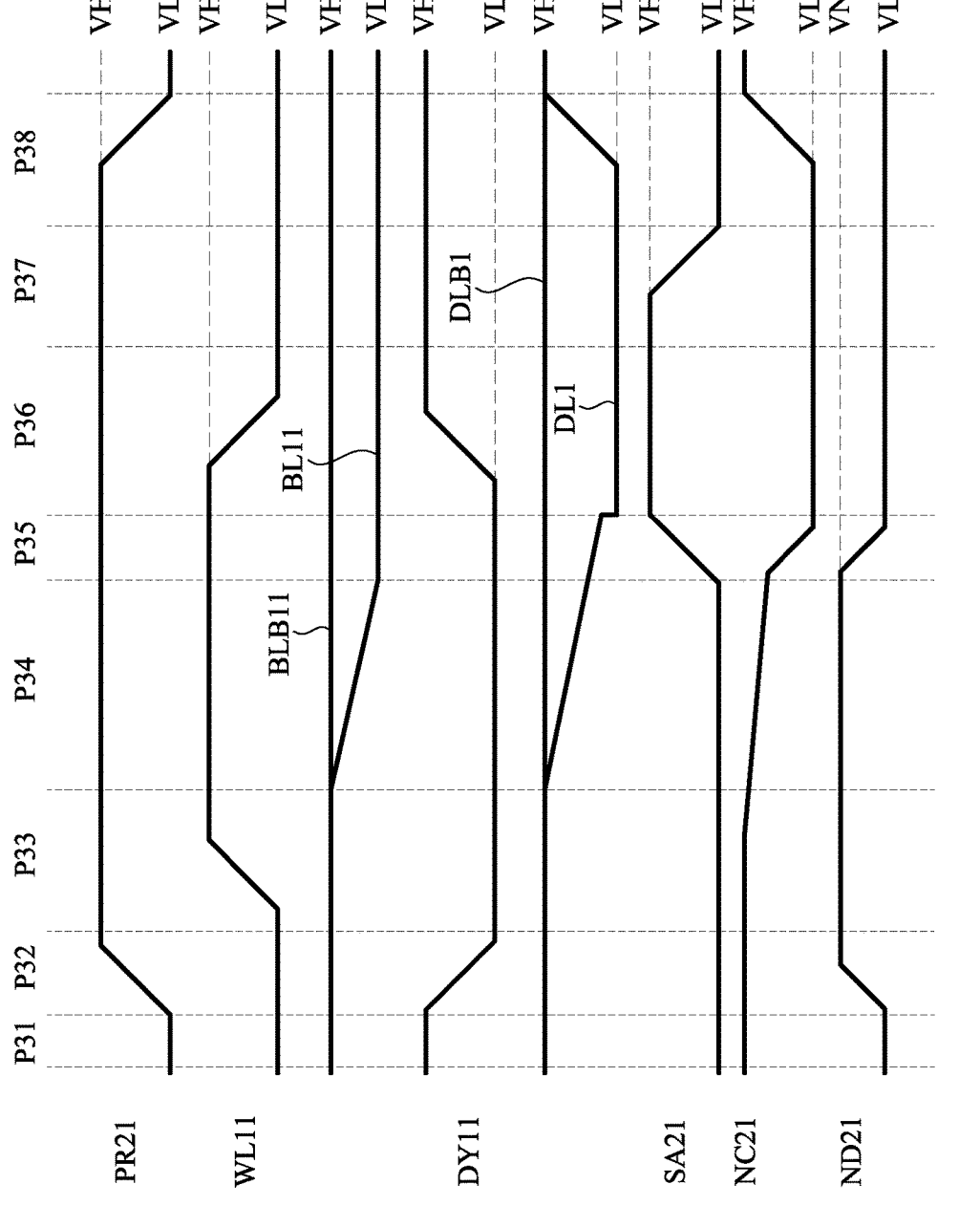
FIG. 3 is a timing diagram of the memory device shown in FIG. 2, in accordance with some embodiments of the present disclosure.

FIG. 3 is a timing diagram of the memory device 100 shown in FIG. 2, in accordance with some embodiments of the present disclosure. As illustratively shown in FIG. 3, the timing diagram 300 includes periods P31-P38 arranged continuously in order. During the periods P31-P38, the signals are operating between the voltage levels VH and VL. In some embodiments, the switches TN11-TN14 and TN21-TN25 are turned on in response to the voltage level VH, and the switches TP11, TP12, SP11-SP18 and TP21-TP24 are turned on in response to the voltage level VL. In some embodiments, the reference voltage signals VDD and VSS have the voltage levels VH and VL, respectively.

During the period P31, the precharge signal PR21 has the voltage level VL, to turn on each of the switches TP23 and TP24. Accordingly, each of the nodes N21 and N22 is charged by the reference voltage signal VDD, such that each of the data line signals DL1 and DLB1 has the voltage level VH. In response to the data line signals DL1 and DLB1 having the voltage level VH, each of the switches TN21 and TN22 is turned on, such that a node voltage signal NC21 of the node N23 has the voltage level VH.

During the period P32, the precharge signal PR21 is changed from the voltage level VL to the voltage level VH to turn on the switch TN23. The switch TN23 charges the node N24 according to the node voltage signal NC21, such that a node voltage signal ND21 of the node N24 is adjusted from the voltage level VL to a voltage level VN. In some embodiments, the voltage level VN is larger than the voltage level VL and is smaller than the voltage level VH. On the other hand, the decoder signal DY11 is changed from the voltage level VH to the voltage level VL.

During the period P33, in response to the voltage level VL of the decoder signal DY11, each of the switches SP11 and SP12 are turned on. The word line signal WL11 is changed from the voltage level VL to the voltage level VH to turn on each of the switches TN11 and TN14. On the other hand, in response to the voltage level VH of the precharge signal PR21, the switch TN23 is turned on to discharge the node N23. Accordingly, the voltage level of the node voltage signal NC21 is decreased. Alternatively stated, charges are shared between the nodes N23 and N24 through the switch TN23 to pull low the node voltage signal NC21.

In the embodiment shown in FIG. 3, the data bits BT1 and BTB1 have the logic values of 0 and 1, respectively. Accordingly, the nodes N11 and N12 have the voltage levels VL and VH, respectively. The embodiments of present disclosure are not limited to this. In other embodiments, the data bits BT1 and BTB1 have the logic values of 1 and 0, respectively.

During the period P34, in response to the voltage level VH of the word line signal WL11, each of the switches TN11 and TN14 is turned on. In response to the voltage level VL of the decoder signal DY11, each of the switches SP11 and SP12 is turned on. In response to the voltage level VL of the node N11, the voltage level of the bit line signal BL11 is decreased. In response to the voltage level VH of the node N12, the bit line signal BLB11 is maintained at the voltage level VH. Accordingly, the node N22 is maintained at the voltage level VH to turn on the switch TN21.

During the period P34, in response to the switch TN21 being turned on, the nodes N21 and N23 are coupled to each other, such that charges are shared between the nodes N21 and N23. Alternatively stated, the node N21 is discharged through the switch TN21. Accordingly, the voltage level of the data line signal DL1 is decreased corresponding to the voltage level of the node voltage signal NC21.

During the period P35, the voltage level of the bit line signal BL11 is discharged to the voltage level VL. On the other hand, the control signal SA21 is changed from the voltage level VL to the voltage level VH to turn on the switch TN25. In response to the switch TN25 being turned on, the reference voltage signal VSS is provided to the node N23 by the switch TN25, and the node voltage signal NC21 is discharged to the voltage level VL.

During the period P35, in response to the voltage level VL of the node voltage signal NC21, the nodes N21 and N24 are discharged through the switches TN21 and TN23, respectively. Accordingly, each of the data line signal DL1 and the node voltage signal ND21 is changed to the voltage level VL.

During the period P36, the word line signal WL11 is changed from the voltage level VH to the voltage level VL to turn off each of the switches TN11 and TN14. The decoder signal DY11 is changed from the voltage level VL to the voltage level VH to turn off each of the switches SP11 and SP12. On the other hand, each of the node voltage signals ND21, NC21 and the data line signal DL1 is maintained at the voltage level VL.

During the period P37, the control signal SA21 is changed from the voltage level VH to the voltage level VL to turn off the switch TN25. At this moment, each of the node voltage signals ND21, NC21 and the data line signal DL1 is maintained at the voltage level VL.

During the period P38, the precharge signal PR21 is changed from the voltage level VH to the voltage level VL to turn off the switch TN23 and turn on the switches TP23 and TP24, such that the switches TP23 and TP24 charge the nodes N21 and N22 by the reference voltage signal VDD. Accordingly, each of the data line signals DL1 DLB1 has the voltage level VL, to turn on each of the switches TN21 and TN22, such that the node N23 is charged to the voltage level VH. On the other hand, in response to the switch TN23 being turned off, the node voltage signal ND21 is maintained at the voltage level VL.

In some approaches, during a read operation, a voltage level difference (also referred to as a read margin) between a data line signal and a corresponding complementary data line signal is larger than a sensing amplifier criteria after a reference voltage signal is provided to the sensing amplifier to discharge the data line signal. As a result, a speed of the read operation is slow.

Compared to above approaches, in some embodiments of present disclosure, before the switch TN25 is turned on to provide the reference voltage signal VSS to the node N23, the nodes N21 and N23 are discharged by the switch TN23 according to the precharge signal PR21, such that the voltage level of the data line signal DL1 is decreased earlier. Accordingly, a read margin between data line signals DL1 and DLB1 meets criteria of the amplifier 130 earlier. As a result, a speed of the read operation is increased.

In some embodiments, the switches TN23 and TN24 are controlled according to a relationship between the voltage level VH of the precharge signal PR21 and the threshold voltage levels of the switches TN23 and TN24. In some embodiments, the voltage level VN is near the threshold voltage level of the switch TN24.

Specifically, when the voltage level VH of the precharge signal PR21 is larger than the threshold voltage level of the switch TN23 plus the threshold voltage level of the switch TN24, each of the switches TN23 and TN24 is turned on to discharge the node N23. When the voltage level VH of the precharge signal PR21 is smaller than the threshold voltage level of the switch TN23 plus the threshold voltage level of the switch TN24, the voltage level VN of the node voltage signal ND21 is smaller than the threshold voltage level of the switch TN24, such that the switch TN24 is turned off and the node N23 in not discharged through the switches TN23 and TN24.

Alternatively stated, when the voltage level VH is high enough, the speed of the read operation is boosted by the discharging through the switches TN23 and TN24. When the voltage level VH is not high enough, the speed of the read operation is not boosted.

In some embodiments, the switches TN23 and TN24 are manufactured as standard threshold voltage (SVT) devices, and each of the threshold voltage levels of the switches TN23 and TN24 is approximately equal to 400 millivolt. In some embodiments, the threshold voltage level of each of the switches TN23 and TN24 is larger than each of threshold voltage levels of other switches, such as the switches TN21, TN22, TN25 and TP21-TP24, of the amplifier 130.

In some embodiments, the switches TN23 and TN24 are also controlled according to a temperature of surrounding environment. In response to a higher temperature, leakages of the switches TN23 and TN24 are higher, such that the threshold voltage levels of the switches TN23 and TN24 are lower.

Specifically, when the temperature is increased, each of the threshold voltage levels of the switches TN23 and TN24 is decreased, such that the precharge signal PR21 is easier to activate the switches TN23 and TN24. When the temperature is decreased, each of the threshold voltage levels of the switches TN23 and TN24 is increased, such that a higher voltage level VH of the precharge signal PR21 is required to activate the switches TN23 and TN24. In some embodiments, for a specific voltage level VH, the switches TN23 and TN24 are turned on when the temperature is larger than a preset temperature, and are turned off when the temperature is smaller than the preset temperature.

In summary, the switches TN23 and TN24 are activated to discharge the node N23 under a high voltage level VH and/or a high temperature, and are deactivated under a low voltage level VH and/or a low temperature.

FIG. 4 is a circuit diagram of detail of a part of a memory device 400 corresponding to the memory device 100 shown in FIG. 2, in accordance with some embodiments of the present disclosure. Referring to FIG. 4 and FIG. 2, the memory device 400 is an alternative embodiment of the memory device 100. FIG. 4 follows a similar labeling convention to that of FIG. 2. For brevity, the discussion will focus more on differences between FIG. 4 and FIG. 2 than on similarities.

Compared with the memory device 100, the memory device 400 includes a switch TP41 instead of the switch TN24. A conductive type of the switch TP41 is different from the conductive type of the switch TN24. For example, the switch TP41 is implemented by a PMOS transistor, and the switch TN24 is implemented by a NMOS transistor.

As illustratively shown in FIG. 4, a terminal of the switch TP41 is coupled to the node N24, another terminal of the switch TP41 is configured to receive the reference voltage signal VSS, and a control terminal of the switch TP41 is also configured to receive the reference voltage signal VSS.

Referring to FIG. 4 and FIG. 3, in some embodiments, the memory device 400 is configured to operate according to the timing diagram 300. Operations of the memory device 400 are similar with the operations of the memory device 100. Therefore, some descriptions are not repeated for brevity.

During the read operation, the node N23 is discharged through the switches TN23 and TP41. Specifically, when the voltage level VH of the precharge signal PR21 is larger than the threshold voltage level of the switch TN23 plus the threshold voltage level of the switch TP41, each of the switches TN23 and TP41 is turned on to discharge the node N23. When the voltage level VH of the precharge signal PR21 is smaller than the threshold voltage level of the switch TN23 plus the threshold voltage level of the switch TP41, the voltage level VN of the node voltage signal ND21 is smaller than the threshold voltage level of the switch TP41, such that the switch TP41 is turned off and the node N23 in not discharged through the switches TN23 and TP41.

In some embodiments, the switches TN23 and TP41 are also controlled according to a temperature of surrounding environment. Specifically, when the temperature is increased, each of the threshold voltage levels of the switches TN23 and TP41 is decreased, such that the precharge signal PR21 is easier to activate the switches TN23 and TP41. When the temperature is decreased, each of the threshold voltage levels of the switches TN23 and TP41 is increased, such that a higher voltage level VH of the precharge signal PR21 is required to activate the switches TN23 and TP41. In some embodiments, for a specific voltage level VH, the switches TN23 and TP41 are turned on when the temperature is larger than a preset temperature, and are turned off when the temperature is smaller than the preset temperature.

FIG. 5 is a flowchart diagram of a method 500 operating the memory device 100 shown in FIG. 2, in accordance with some embodiments of the present disclosure. As illustratively shown in FIG. 5, the method 500 includes operations OP51-OP54.

During the operation OP51, the switches TP23 and TP24 charge the nodes N21 and N22 according to the precharge signal PR21. The nodes N21 and N22 correspond to the data line signals DL1 and DLB1, respectively. A data bit of the data signal DTI is complementary with a data bit of the data signal DLB1.

During the operation OP52, the switches TN23 and TN24 discharges the node N23 according to the precharge signal PR21 and the reference voltage signal VSS.

During the operation OP53, the switch TN21 discharges the node N21. The switch TN21 is coupled between the nodes N21 and N23. In some embodiments, the operation OP54 is performed after the operation OP53.

During the operation OP54, after the node N23 is discharged according to the precharge signal PR21, the switch TN25 provides the reference voltage signal VSS to the node N23 to further discharge the node N21.

Figure 6:
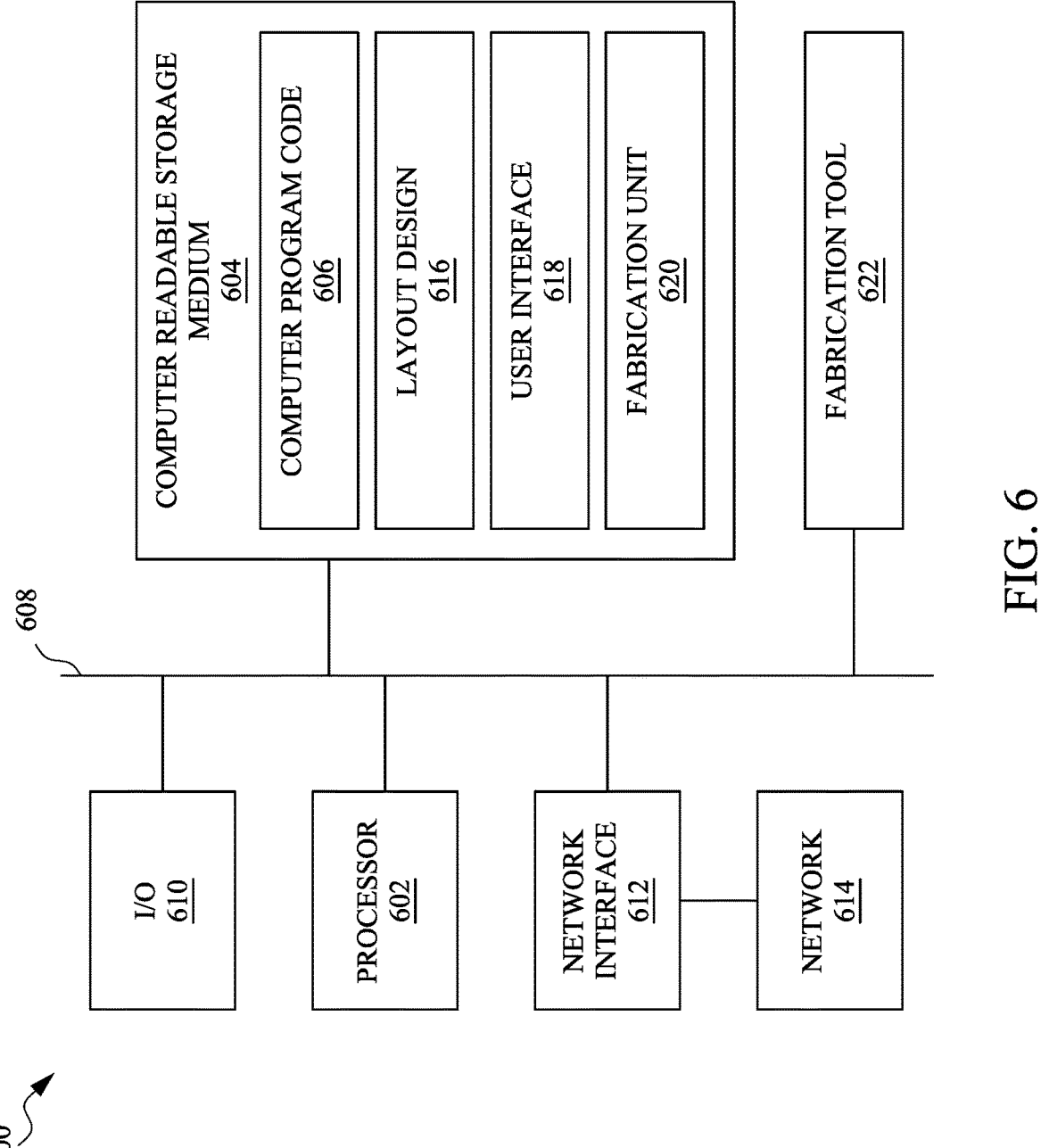
FIG. 6 is a schematic view of a system for designing and manufacturing of the memory device shown in FIG. 2, in accordance with some embodiments of the present disclosure.

FIG. 6 is a schematic view of a system 600 for designing and manufacturing of the memory device 100 shown in FIG. 2, in accordance with some embodiments of the present disclosure. The system 600 generates or places one or more IC layout designs, as described herein. In some embodiments, the system 600 manufactures one or more semiconductor devices based on the one or more IC layout designs, as described herein. The system 600 includes a hardware processor 602 and a non-transitory, computer readable storage medium 604 encoded with, e.g., storing, the computer program code 606, e.g., a set of executable instructions. The computer readable storage medium 604 is configured for interfacing with manufacturing machines for producing the semiconductor device. The processor 602 is electrically coupled to the computer readable storage medium 604 by a bus 608. The processor 602 is also electrically coupled to an I/O interface 610 by the bus 608. A network interface 612 is also electrically connected to the processor 602 by the bus 608. Network interface 612 is connected to a network 614, so that the processor 602 and the computer readable storage medium 604 are capable of connecting to external elements via network 614. The processor 602 is configured to execute the computer program code 606 encoded in the computer readable storage medium 604 in order to cause the system 600 designing and manufacturing the memory device 100.

In some embodiments, the processor 602 is a central processing unit (CPU), a multi-processor, a distributed processing system, an application specific integrated circuit (ASIC), and/or a suitable processing unit.

In some embodiments, the computer readable storage medium 604 is an electronic, magnetic, optical, electromagnetic, infrared, and/or a semiconductor system (or apparatus or device). For example, the computer readable storage medium 604 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 604 includes a compact disk-read only memory (CD-ROM), a compact disk-read/write (CD-R/W), and/or a digital video disc (DVD).

In some embodiments, the computer readable storage medium 604 also stores information needed for designing and manufacturing the memory device 100 as well as information generated during performance of method 2000, such as layout design 616, user interface 618, fabrication unit 620, and/or a set of executable instructions to perform the operation of designing and manufacturing the memory device 100.

In some embodiments, the computer readable storage medium 604 stores instructions (e.g., the computer program code 606) for interfacing with manufacturing machines. The instructions (e.g., the computer program code 606) enable the processor 602 to generate manufacturing instructions readable by the manufacturing machines to effectively implement the designing and manufacturing the memory device 100 during a manufacturing process.

The system 600 includes the I/O interface 610. The I/O interface 610 is coupled to external circuitry. In some embodiments, the I/O interface 610 includes a keyboard, keypad, mouse, trackball, trackpad, and/or cursor direction keys for communicating information and commands to the processor 602.

The system 600 also includes the network interface 612 coupled to the processor 602. The network interface 612 allows the system 600 to communicate with the network 614, to which one or more other computer systems are connected. The network interface 612 includes wireless network interfaces such as BLUETOOTH, WIFI, WIMAX, GPRS, or WCDMA; or wired network interface such as ETHERNET, USB, or IEEE-13154. In some embodiments, the designing and manufacturing the memory device 100 is implemented in two or more systems 600, and information such as layout design, user interface and fabrication unit are exchanged between different systems 600 by the network 614.

The system 600 is configured to receive information related to a layout design through the I/O interface 610 or network interface 612. The information is transferred to the processor 602 by the bus 608 to determine a layout design for producing an IC. The layout design is then stored in the computer readable storage medium 604 as the layout design 616. The system 600 is configured to receive information related to a user interface through the I/O interface 610 or network interface 612. The information is stored in the computer readable storage medium 604 as the user interface 618. The system 600 is configured to receive information related to a fabrication unit through the I/O interface 610 or network interface 612. The information is stored in the computer readable storage medium 604 as the fabrication unit 620. In some embodiments, the fabrication unit 620 includes fabrication information utilized by the system 600.

In some embodiments, the designing and manufacturing the memory device 100 is implemented as a standalone software application for execution by a processor. In some embodiments, the designing and manufacturing the memory device 100 is implemented as a software application that is a part of an additional software application. In some embodiments, the designing and manufacturing the memory device 100 is implemented as a plug-in to a software application. In some embodiments, the designing and manufacturing the memory device 100 is implemented as a software application that is a portion of an EDA tool. In some embodiments, the designing and manufacturing the memory device 100 is implemented as a software application that is used by an EDA tool. In some embodiments, the EDA tool is used to generate a layout design of the integrated circuit device. In some embodiments, the layout design is stored on a non-transitory computer readable medium. In some embodiments, the layout design is generated using a tool such as VIRTUOSO® available from CADENCE DESIGN SYSTEMS, Inc., or another suitable layout generating tool. In some embodiments, the layout design is generated based on a netlist which is created based on the schematic design. In some embodiments, the designing and manufacturing the memory device 100 is implemented by a manufacturing device to manufacture an integrated circuit using a set of masks manufactured based on one or more layout designs generated by the system 600. In some embodiments, the system 600 includes a manufacturing device (e.g., fabrication tool 622) to manufacture an integrated circuit using a set of masks manufactured based on one or more layout designs of the present disclosure.

Figure 7:
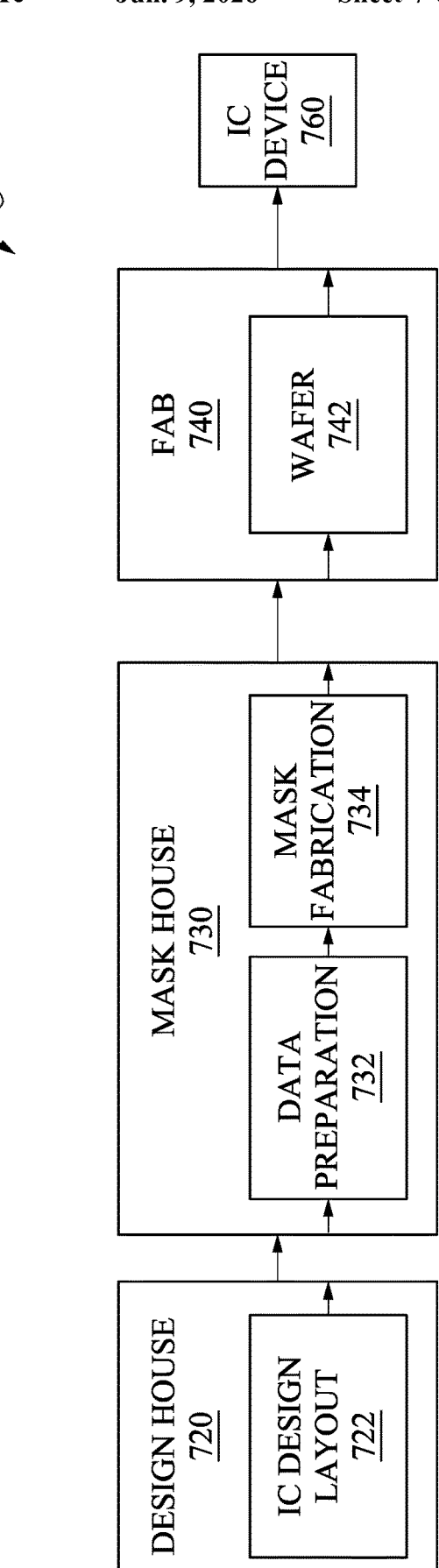
FIG. 7 is a block diagram of an integrated circuit (IC)/ semiconductor device manufacturing system, and an IC manufacturing flow associated therewith, in accordance with some embodiments of the present disclosure.

FIG. 7 is a block diagram of an integrated circuit (IC)/semiconductor device manufacturing system 700, and an IC manufacturing flow associated therewith, in accordance with some embodiments of the present disclosure.

In FIG. 7, the IC manufacturing system 700 includes entities, such as a design house 720, a mask house 730, and an IC manufacturer/fabricator ("fab") 740, that interact with one another in the design, development, and manufacturing cycles and/or services related to manufacturing an IC device (semiconductor device) 760. In some embodiments, the memory device is implemented by the IC device 760. The entities in system 700 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 720, mask house 730, and IC fab 740 is owned by a single company. In some embodiments, two or more of design house 720, mask house 730, and IC fab 740 coexist in a common facility and use common resources.

The design house (or design team) 720 generates an IC design layout 722. The IC design layout 722 includes various geometrical patterns designed for the IC device 760. The geometrical patterns correspond to patterns of metal, oxide, or semiconductor layers that make up the various components of the IC device 760 to be fabricated. The various layers combine to form various IC features. For example, a portion of the IC design layout 722 includes various IC features, such as an active region, gate structures, source/drain structures, interconnect structures, and openings for bonding pads, to be formed in a semiconductor substrate (such as a silicon wafer) and various material layers disposed on the semiconductor substrate. The design house 720 implements a proper design procedure to form the IC design layout 722. The design procedure includes one or more of logic design, physical design or place and route. The IC design layout 722 is presented in one or more data files having information of the geometrical patterns. For example, the IC design layout 722 can be expressed in a GDSII file format or DFII file format.

The mask house 730 includes mask data preparation 732 and mask fabrication 734. The mask house 730 uses the IC design layout 722 to manufacture one or more masks to be used for fabricating the various layers of the IC device 760 according to the IC design layout 722. The mask house 730 performs the mask data preparation 732, where the IC design layout 722 is translated into a representative data file ("RDF"). The mask data preparation 732 provides the RDF to the mask fabrication 734. The mask fabrication 734 includes a mask writer. A mask writer converts the RDF to an image on a substrate, such as a mask (reticle) or a semiconductor wafer, or a metal layer which is formed and thereafter selectively etched to form a redistribution layer at a back end of line process of the fab. The design layout is manipulated by the mask data preparation 732 to comply with particular characteristics of the mask writer and/or requirements of the IC fab 740. In FIG. 7, the mask data preparation 732 and mask fabrication 734 are illustrated as separate elements. In some embodiments, the mask data preparation 732 and mask fabrication 734 can be collectively referred to as mask data preparation.

In some embodiments, the mask data preparation 732 includes optical proximity correction (OPC) which uses lithography enhancement techniques to compensate for image errors, such as those that can arise from diffraction, interference, other process effects and the like. OPC adjusts the IC design layout 722. In some embodiments, the mask data preparation 732 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 732 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during the mask fabrication 734, which may undo part of the modifications performed by OPC in order to meet mask creation rules.

In some embodiments, the mask data preparation 732 includes lithography process checking (LPC) that simulates processing that will be implemented by the IC fab 740 to fabricate the IC device 760. LPC simulates this processing based on the IC design layout 722 to create a simulated manufactured device, such as the IC device 760. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC can be repeated to further refine the IC design layout 722.

It should be understood that the above description of the mask data preparation 732 has been simplified for the purposes of clarity. In some embodiments, the mask data preparation 732 includes additional features such as a logic operation (LOP) to modify the IC design layout according to manufacturing rules. Additionally, the processes applied to the IC design layout 722 during the mask data preparation 732 may be executed in a variety of different orders.

After the mask data preparation 732 and during mask fabrication 734, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by the mask fabrication 734 is used in a variety of processes. For example, such a mask(s) is used in an ion implantation process to form various doped regions in the semiconductor wafer, in an etching process to form various etching regions in the semiconductor wafer, and/or in other suitable processes.

The IC fab 740 is an IC fabrication entity that includes one or more manufacturing facilities for the fabrication of a variety of different IC products. In some embodiments, the IC fab 740 is a semiconductor foundry. For example, there may be a first manufacturing facility for the front end fabrication of a plurality of IC products (e.g., source/drain structures, gate structures), while a second manufacturing facility may provide the middle end fabrication for the interconnection of the IC products (e.g., MDs, VDs, VGs) and a third manufacturing facility may provide the back end fabrication for the interconnection and packaging of the IC products (e.g., M0 tracks, M1 tracks, BM0 tracks, BM1 tracks), and a fourth manufacturing facility may provide other services for the foundry entity.

The IC fab 740 uses the mask (or masks) fabricated by the mask house 730 to fabricate the IC device 760. Thus, the IC fab 740 at least indirectly uses the IC design layout 722 to fabricate the IC device 760. In some embodiments, a semiconductor wafer is fabricated by the IC fab 740 using the mask (or masks) to form the IC device 760. The semiconductor wafer 742 includes a silicon substrate or other proper substrate having material layers formed thereon. Semiconductor wafer further includes one or more of various doped regions, dielectric features, multilevel interconnects, and the like (formed at subsequent manufacturing steps).

The system 700 is shown as having the design house 720, mask house 730, and IC fab 740 as separate components or entities. However, it should be understood that one or more of the design house 720, mask house 730 or IC fab 740 are part of the same component or entity.

Also disclosed is a memory device. The memory device includes a memory cell and an amplifier. The memory cell is configured to store a first data bit. The amplifier is configured to generate a first data signal at a first node according to the first data bit, and configured to charge the first node according to a precharge signal. After the first node is charged according to the precharge signal, the amplifier is further configured to discharge the first node according to the precharge signal.

Also disclosed is a memory device. The memory device includes an amplifier. The amplifier includes a first switch, a second switch, a third switch and a fourth switch. A first terminal of the first switch is coupled to a first node, a second terminal of the first switch is coupled to a second node, and a control terminal of the first switch is coupled to a third node. A first terminal of the second switch is coupled to the third node, a second terminal of the second switch is coupled to the second node, and a control terminal of the second switch is coupled to the first node. A first terminal of the third switch is coupled to the third node, a control terminal of the third switch is configured to receive a precharge signal. A first terminal of the fourth switch is coupled to the third node, a control terminal of the fourth switch is configured to receive the precharge signal.

Also disclosed is a method. The method includes: charging, according to a precharge signal, a first node and a second node corresponding to a first data signal and a second data signal, respectively; discharging a third node according to the precharge signal and a reference voltage signal; discharging the first node by a first switch coupled between the first node and the third node; and after the third node is discharged according to the precharge signal, providing the reference voltage signal to the third node to further discharge the first node. The first data signal is complementary with the second data signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a memory cell configured to store a first data bit; and
an amplifier configured to generate a first data signal at a first node according to the first data bit, and configured to charge the first node according to a precharge signal,
wherein after the first node is charged according to the precharge signal, the amplifier is further configured to discharge the first node according to the precharge signal,
wherein the amplifier comprises:
a first switch coupled to a second node and controlled by the precharge signal; and
a second switch coupled between the first node and the second node.

2. The memory device of claim 1, wherein
the first switch is coupled between the second node and a third node; and
the amplifier further comprises a third switch, each of a first terminal of the third switch and a control terminal of the third switch being coupled to the third node,
wherein the first node is discharged through the second node.

3. The memory device of claim 2, wherein the amplifier further comprises:
a fourth switch configured to provide a reference voltage signal to the second node,
wherein a second terminal of the third switch is configured to receive the reference voltage signal.

4. The memory device of claim 1, wherein the amplifier comprises:
a third switch configured to charge the first node according to the precharge signal.

5. The memory device of claim 4, wherein a conductive type of the first switch is different from a conductive type of the third switch.

6. The memory device of claim 1, wherein
the first switch is configured to discharge the second node according to the precharge signal; and
the amplifier further comprises a third switch coupled in series with the first switch,
wherein when a voltage level of the precharge signal is larger than a threshold voltage level of the first switch plus a threshold voltage level of the third switch, each of the first switch and the third switch is turned on.

7. The memory device of claim 6, wherein when the voltage level of the precharge signal is smaller than the threshold voltage level of the first switch plus the threshold voltage level of the third switch, the third switch is turned off.

8. The memory device of claim 6, wherein
when a temperature is higher than a preset temperature, the third switch is turned on, and
when the temperature is lower than the preset temperature, the third switch is turned off.

9. The memory device of claim 1, wherein
the first switch is coupled between the second node and a third node; and
the amplifier further comprises a third switch, a first terminal of the third switch being coupled to the third node, and a second terminal of the third switch being coupled to a control terminal of the third switch, wherein the first node is discharged through the second node.

10. A memory device, comprising an amplifier, the amplifier comprising:
a first switch, a first terminal of the first switch being coupled to a first node, a second terminal of the first switch being coupled to a second node, and a control terminal of the first switch being coupled to a third node;
a second switch, a first terminal of the second switch being coupled to the third node, a second terminal of the second switch being coupled to the second node, and a control terminal of the second switch being coupled to the first node;
a third switch, a first terminal of the third switch being coupled to the second node, a control terminal of the third switch being configured to receive a precharge signal; and
a fourth switch, a first terminal of the fourth switch being coupled to the third node, a control terminal of the fourth switch being configured to receive the precharge signal,
wherein the fourth switch is turned off when the third switch is turned on.

11. The memory device of claim 10, wherein the fourth switch is turned on when the third switch is turned off.

12. The memory device of claim 10, wherein the amplifier further comprises:
a fifth switch coupled in series with the third switch, and configured to receive a reference voltage signal; and
a sixth switch coupled to the second node, and configured to receive the reference voltage signal.

13. The memory device of claim 12, wherein a control terminal of the fifth switch is coupled to the third switch.

14. The memory device of claim 12, wherein a control terminal of the fifth switch is configured to receive the reference voltage signal.

15. The memory device of claim 12, wherein the third switch is turned on before the sixth switch is turned on.

16. A method, comprising:
charging, according to a precharge signal, a first node and a second node corresponding to a first data signal and a second data signal, respectively;
discharging a third node according to the precharge signal and a reference voltage signal;
discharging the first node by a first switch coupled between the first node and the third node; and
after the third node is discharged according to the precharge signal, providing the reference voltage signal to the third node to further discharge the first node,
wherein the first data signal is complementary with the second data signal.

17. The method of claim 16, wherein discharging the third node comprises:
turning on a second switch coupled between the third node and a fourth node; and
turning on a third switch according to a voltage level of the fourth node,
wherein the third switch is configured to receive the reference voltage signal.

18. The method of claim 17, wherein
the third switch is turned on when a voltage level of the precharge signal is larger than a threshold voltage level of the second switch plus a threshold voltage level of the third switch, and the third switch is turned off when the voltage level of the precharge signal is larger than the threshold voltage level of the second switch plus the threshold voltage level of the third switch.

19. The method of claim 17, wherein when a temperature is higher than a preset temperature, the third switch is turned on, and when the temperature is lower than the preset temperature, the third switch is turned off.

20. The method of claim 17, wherein providing the reference voltage signal comprises:

turning on a fourth switch coupled to the third node after the second switch is turned on, wherein the fourth switch is configured to receive the reference voltage signal.

\* \* \* \* \*